United States Patent [19]

Hosoya

[11] Patent Number: 5,610,551
[45] Date of Patent: Mar. 11, 1997

[54] FILTER CIRCUIT

[75] Inventor: Nobukazu Hosoya, Nara, Japan

[73] Assignee: Sanyo Electric Co., Ltd., Osaka, Japan

[21] Appl. No.: 377,376

[22] Filed: Jan. 25, 1995

[30] Foreign Application Priority Data

Jan. 26, 1994 [JP] Japan .................... 6-006958

[51] Int. Cl.⁶ .................. H03K 5/00; H03B 1/00
[52] U.S. Cl. .............. 327/552; 327/560; 327/311; 330/303; 330/109
[58] Field of Search ................ 327/551, 552, 327/553, 554, 555, 556, 557, 558, 336, 311, 561, 560; 330/303, 306, 305, 107, 109; 333/173

[56] References Cited

U.S. PATENT DOCUMENTS

| | | | |
|---|---|---|---|
| 5,001,441 | 3/1991 | Gen-Kuong | 330/306 |
| 5,317,217 | 5/1994 | Rieger et al. | 327/552 |

FOREIGN PATENT DOCUMENTS

| | | | |
|---|---|---|---|
| 2246409 | 10/1990 | Japan | 327/552 |
| 5063505 | 3/1993 | Japan | 32/552 |

OTHER PUBLICATIONS

"High–Q Active Filter", IBM Technical Disclosure Bulletin, vol. 13 No. 12 May 1971, pp. 3586–3589.
Soliman, *Novel Grounded C Biquad Circuits Using the DVCCS/DVCVS*, 2213 Frequenz vol. 34, (1980), Okt. No. 10, Berlin, Germany, pp. 288–291.

Patent Abstracts of Japan, vol. 13, No. 243 (E–768), Jun. 7, 1989 of JP 1044615 (Toshiba Corp.), Feb. 17, 1989.

*Primary Examiner*—Timothy P. Callahan
*Assistant Examiner*—Dinh T. Le
*Attorney, Agent, or Firm*—Armstrong, Westerman, Hattori, McLeland & Naughton

[57] ABSTRACT

A filter circuit includes a differential amplifier having a mutual conductance of $g_{m1}$, and a transistor $T_1$ which attenuates an output current of the differential amplifier by $1/\beta$ ($\beta$ is a current amplification factor) is arranged at a stage succeeding to the differential amplifier, whereby terms of $g_{m1}$ in equations respectively representative of a resonance frequency $\omega_0$ and a quality factor Q are multiplied by $1/\beta$, respectively. Since the term of $g_{m1}$ exists in a numerator within a root symbol ($\sqrt{\phantom{x}}$) in the equation representative of the resonance frequency $\omega_0$, by arranging the transistor $T_1$, the resonance frequency $\omega_0$ can be decreased by $1/\sqrt{+e}$,fra +ee $\beta$ times. Furthermore, since the term of $g_{m1}$ exists in a denominator within a root symbol ($\sqrt{\phantom{x}}$) in the equation representative of the quality factor Q, by arranging the transistor $T_1$, the quality factor can be increased by $\sqrt{\phantom{x}}\beta$ times.

8 Claims, 12 Drawing Sheets

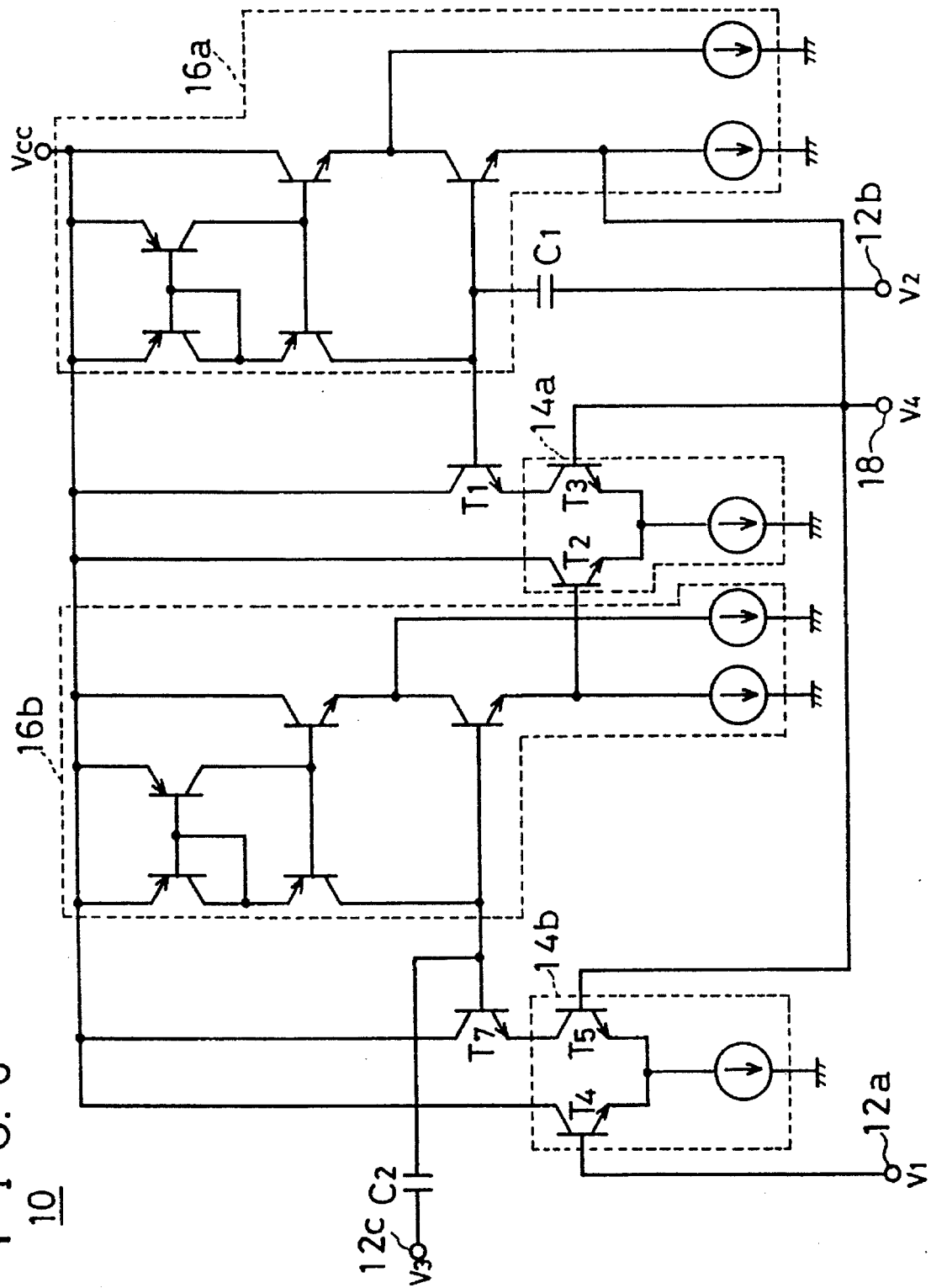

FILTER CIRCUIT

BACKGROUND OF THE INVENTION

1. Field of the invention

The present invention generally relates to a filter circuit. More specifically, the present invention relates to a filter circuit including a first integrator to which a first input and a fed-back input are inputted, and a second integrator to which an output of the first integrator and a fed-back input are inputted.

2. Description of the Prior Art

In reference to FIG. 17, a conventional filter circuit 1 includes an output terminal 3 from which a signal obtained through a filtering process of a signal inputted from one of input terminals 2a and 2b is outputted. On the assumption that inputs from the input terminals 2a and 2b are $V_1$ and $V_2$, respectively, and an output of the output terminal 3 is $V_4$, and a mutual conductance of a differential amplifier 4a is $g_{m1}$, the output $V_4$ is representative by the following equation 1. In addition, at a stage succeeding to the differential amplifier 4a, a buffer 5a is arranged.

$$V_4 = \frac{S \cdot \frac{C_1}{g_{m1}} \cdot V_2 + V_1}{S \cdot \frac{C_1}{g_{m1}} + 1} \quad (1)$$

Furthermore, in view of the above described equation 1, a resonance frequency $\omega_0$ can be represented by the following equation 2.

$$\omega_0 = \frac{g_{m1}}{C_1} \quad (2)$$

Furthermore, in FIG. 18, another conventional filter circuit 1 is shown. The filter circuit 1 shown in FIG. 18 is a filter in which a differential amplifier 4b having a mutual conductance of $g_{m2}$ and a buffer 5b are inserted between the input terminal 2a and the differential amplifier 4a of the filter circuit 1 shown in FIG. 17. An output of the buffer 5a is fed-back to the differential amplifier 4b; and an input terminal 2c is connected to a connection point of the differential amplifier 4b and the buffer 5b via a capacitor $C_2$. In this case, when an input from the input terminal 2c is $V_3$, the output $V_4$ can be represented by the following equation 3:

$$V_4 = \frac{S^2 V_2 + S \cdot \frac{g_{m1}}{C_1} V_3 + \frac{g_{m1} \cdot g_{m2}}{C_1 \cdot C_2} V_1}{S^2 + S \cdot \frac{g_{m1}}{C_1} + \frac{g_{m1} \cdot g_{m2}}{C_1 \cdot C_2}} \quad (3)$$

In addition, a resonance frequency $\omega_0$ and a quality factor Q are represented by the following equations 4 and 5, respectively.

$$\omega_0 = \sqrt{\frac{g_{m1} \cdot g_{m2}}{C_1 \cdot C_2}} \quad (4)$$

$$Q = \sqrt{\frac{g_{m2} \cdot C_1}{g_{m1} \cdot C_2}} \quad (5)$$

In the filter circuit 1 shown in FIG. 17, in order to make the resonance frequency low, as seen from the equation 2, it is necessary to make the mutual conductance $g_{m1}$ small and a capacity of the capacitor $C_1$ large. However, if the mutual conductance $g_{mi}$ is made small, it is necessary to operate a transistor included in the differential amplifier 4a in a region where a current amount of the transistor is small, and therefore, a frequency characteristic of the transistor becomes bad. Consequently, it becomes difficult to operate the transistor in a region where an S/N is large. Furthermore, if the capacity of the capacitor $C_1$ is made large, a chip area of an integrated circuit becomes large. Accordingly, it was difficult to set the resonance frequency low in the integrated circuit. Such a problem also occurs in the filter circuit 1 shown in FIG. 18.

SUMMARY OF THE INVENTION

Therefore, a principal object of the present invention is to provide a filter circuit in which a resonance frequency can be made low without making a capacity of a capacitor large.

A filter circuit according to the present invention comprises first, second and third terminals; a first integrator having a first input and a second input respectively connected to the first terminal and the third terminal; a first current attenuation means which is connected to an output of the first integrator, and attenuates an output current of the first integrator; and a first capacitor connected between an output of the first current attenuation means and the second terminal, wherein an output signal is obtained from the third terminal when an input signal is applied from at least one of the first terminal and the second terminal.

By arranging a transistor which attenuates a current by 1/β (β is a current amplification factor) at a stage succeeding to a differential amplifier having a mutual conductance of $g_{m1}$, for example, a term of $g_{m1}$ included in a numerator of an equation representing a resonance frequency $\omega_0$ is decreased by 1/β times.

In accordance to the present invention, only by arranging the current attenuation means, even if the capacity of the capacitor is not made large, it is possible to make the resonance frequency of the filter circuit low. In other words, with the same frequency, it is possible to make the capacity of the capacitor small.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram showing FIG. 5 embodiment;

DETAILED DESCRIPTION OF THE PREFERRED EMBODIMENTS

Figure 1:
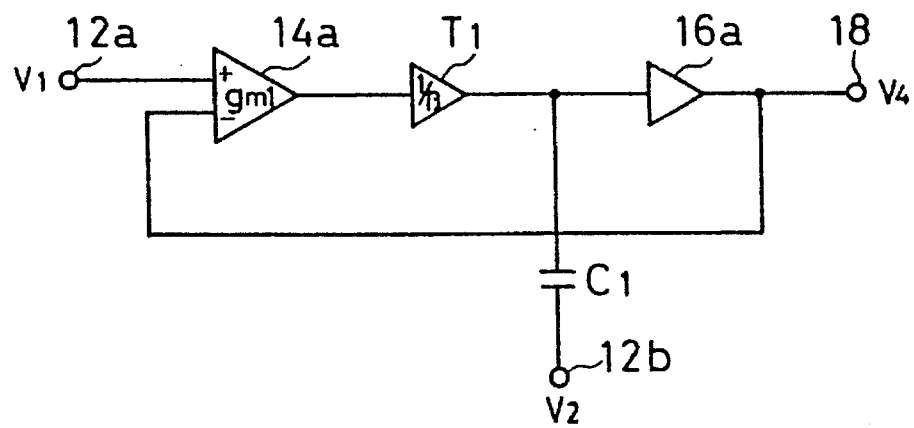
FIG. 1 is a block diagram showing one embodiment according to the present invention.

In reference to FIG. 1, a filter circuit 10 of this embodiment shown includes input terminals 12a and 12b, and the input terminal 12a is connected to a non-inverted input terminal of a differential amplifier 14a having a mutual conductance of $g_{m1}$. An output terminal of the differential amplifier 14a is connected to an output terminal 18 via a transistor $T_1$ having an attenuation rate of $1/\beta$ and a buffer 16a, and the input terminal 12b is connected to an output terminal of the transistor $T_1$ via a capacitor $C_1$. Furthermore, an output terminal of the buffer 16a is connected to an inverted input terminal of the differential amplifier 14a. Then, a signal is inputted from one of the input terminals 12a and 12b, and a signal subjected to a filtering process is outputted from the output terminal 18.

Figure 2:
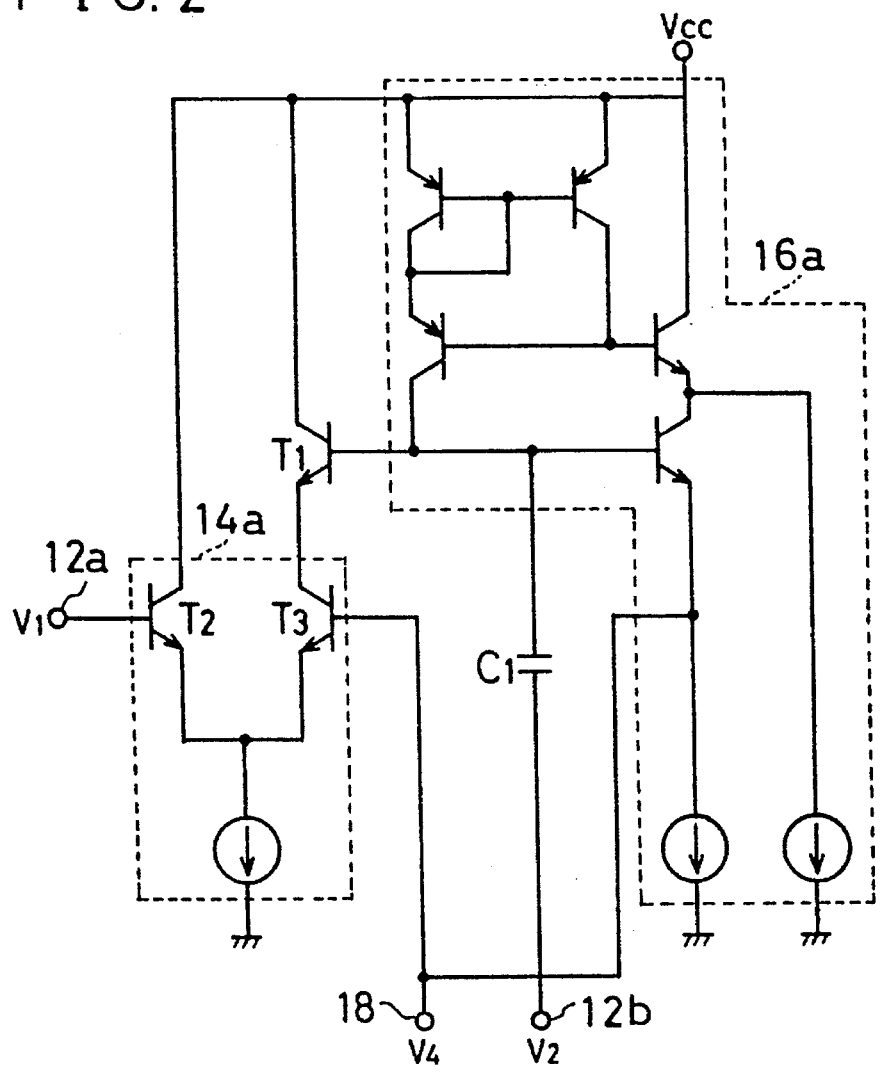
FIG. 2 is a circuit diagram showing FIG. 1 embodiment.

Next, an equivalent circuit diagram of the filter circuit 10 shown in FIG. 1 is shown in FIG. 2. An input from the input terminal 12a is applied to a base of a transistor $T_2$ included in a differential amplifier 14a, and an output from the buffer 16a is fed-back to a base of a transistor $T_3$. Therefore, a current in proportion to a difference between base inputs of the transistors $T_2$ and $T_3$ is outputted from the differential amplifier 14a, and the current flows between a collector and an emitter of the transistor $T_1$. Therefore, a current of $1/\beta$ of an output current from the differential amplifier 14a is outputted from a base of the transistor $T_1$, and the same is inputted to the buffer 16a. Furthermore, an input from the input terminal 12b is also applied to the buffer 16a via the capacitor $C_1$. Then, the output of the buffer 16a is outputted from the output terminal 18, and fed-back to the base of the transistor $T_3$.

On the assumption that the inputs from the input terminals 12a and 12b are $V_1$ and $V_2$, respectively, and the output from the output terminal 18 is $V_4$, a transfer function of the filter circuit 10 can be represented by the following equation 6:

$$V_4 = \frac{S \cdot \frac{C_1}{g_{m1}} \cdot \beta \cdot V_2 + V_1}{S \cdot \frac{C_1}{g_{m1}} \cdot \beta + 1} \quad (6)$$

Furthermore, in view of the equation 6, a resonance frequency $\omega_0$ can be represented by the following equation 7.

$$\omega_0 = \frac{g_{m1}}{C_1} \cdot \frac{1}{\beta} \quad (7)$$

By arranging the transistor $T_1$ at a stage succeeding to the differential amplifier 14a, as seen from the equation 7, it is possible to decrease the resonance frequency $\omega_0$ by $1/\beta$ times a resonance frequency at a time that no transistor $T_1$ is provided. Therefore, if the resonance frequency $\omega_0$ is made the same as the resonance frequency at the time that no transistor is provided, a capacitor of the capacitor C1 can be decreased $1/\beta$ times.

Figure 3:
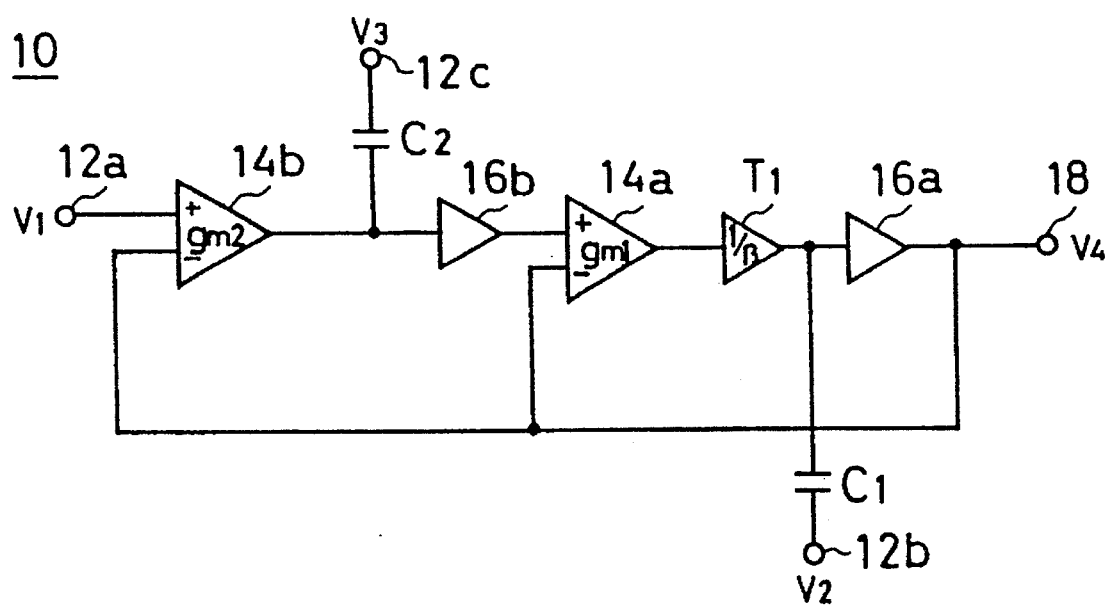
FIG. 3 is a block diagram showing another embodiment according to the present invention.

In reference to FIG. 3, a filter circuit 10 of another embodiment according to the present invention includes the input terminals 12a, 12b and 12c, and the input terminal 12a is connected to a non-inverted input terminal of a differential amplifier 14b having a mutual conductance of $g_{m2}$. An output terminal of the differential amplifier 14b is connected to a non-inverted input terminal of a differential amplifier 14a having a mutual conductance of $g_{m1}$ via a buffer 16b. The input terminal 12c is also connected to the output terminal of the differential amplifier 14b via a capacitor $C_2$. An output terminal of the differential amplifier 14a is connected to an output terminal 18 via a transistor $T_1$ having an attenuation rate of $1/\beta$ and a buffer 16b, and to an output terminal of the transistor $T_1$, the input terminal 12b is connected via the capacitor $C_1$. Furthermore, an output terminal of the buffer 16a is connected to inverted input terminals of the differential amplifiers 14a and 14b. Then, a signal is inputted to any one of the input terminals 12a, 12b and 12c, and a signal subjected to a filtering process is outputted from the output terminal 18.

Figure 4:
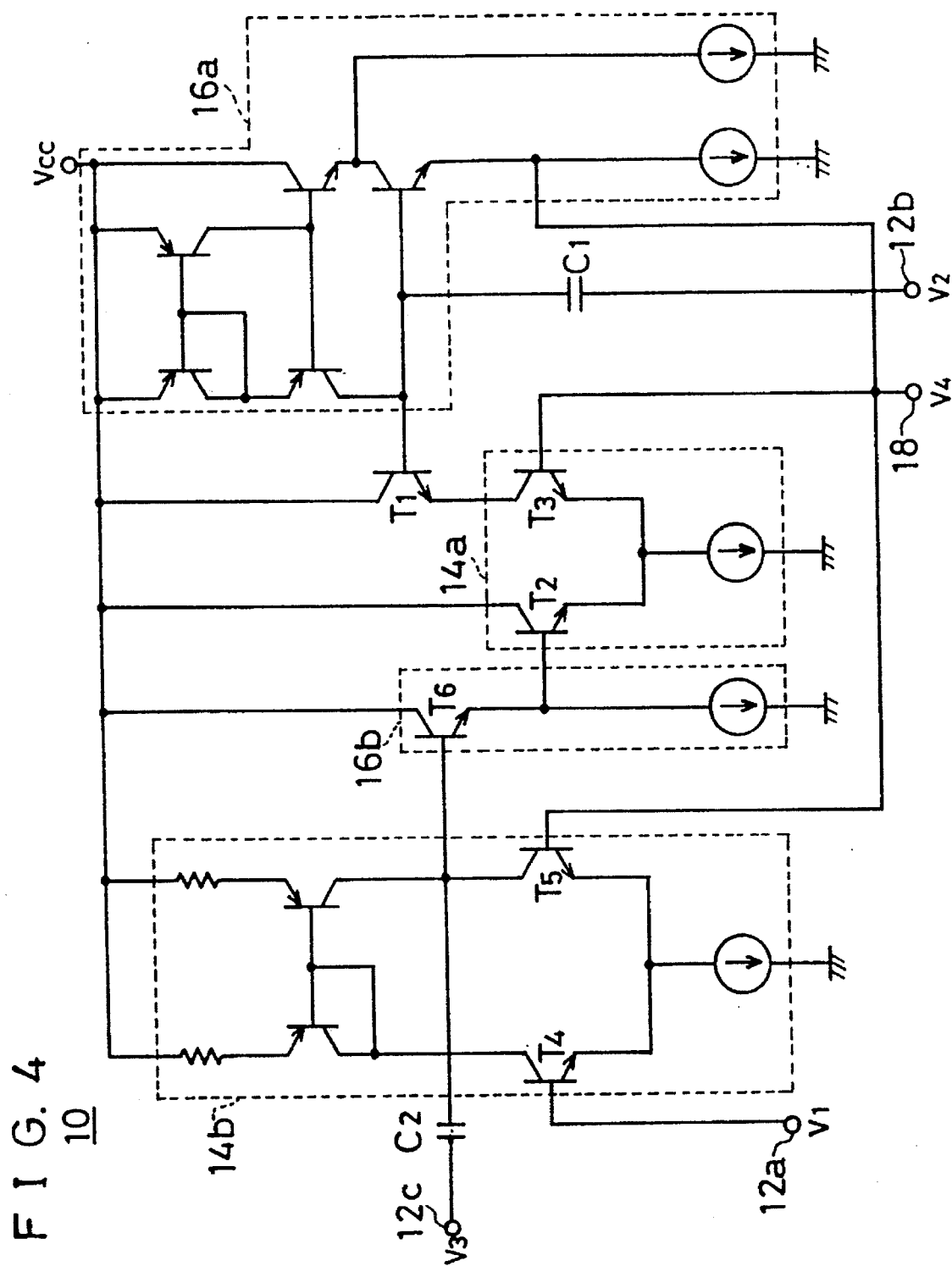
FIG. 4 is a circuit diagram showing FIG. 3 embodiment.

Next, an equivalent circuit diagram of the filter circuit 10 shown in FIG. 3 is shown in FIG. 4. An input from the input terminal 12a is applied to a transistor $T_4$ included in the differential amplifier 14b, and the output from the buffer 16a is fed-back to a transistor $T_5$ included in the differential amplifier 14b. Then, an output in proportion to a difference between these inputs is applied to a base of a transistor $T_6$ included in the buffer 16b. To the base of the transistor $T_6$, an input from the input terminal 12c is also applied via the capacitor C2. Then, a portion of an emitter current of the transistor $T_6$ is inputted to a base of the transistor $T_2$ included in the differential amplifier 14b, and the output of the buffer 16a is fed-back to a base of the transistor $T_3$ included in the differential amplifier 14a. Therefore, a current in proportion to a difference between base inputs of the transistors $T_2$ and $T_3$ is outputted from the differential amplifier 14a. The output current flows between a collector and an emitter of the transistor $T_1$, whereby a current of $1/\beta$ times the output current is outputted from the base of the transistor $T_1$. The base current is inputted to the buffer 16a. Furthermore, an input from the input terminal 12b is also applied to the buffer 16a via the capacitor $C_2$. Then, the output from the buffer a is outputted from the output terminal 18, and the same is fed-back to the bases of the transistors $T_3$ and $T_5$.

On the assumption that the inputs from the input terminals 12a, 12b and 12c are $V_1$, $V_2$ and $V_3$, respectively, and the output from the output terminal 18 is $V_4$, a transfer function of the filter circuit 10 can be represented by the following equation 8:

$$V_4 = \frac{S^2 V_2 + S \cdot \frac{g_{m1}}{C_1} \cdot \frac{1}{\beta} \cdot V_3 + \frac{g_{m1} \cdot g_{m2}}{C_1 \cdot C_2} \cdot \frac{1}{\beta} \cdot V_1}{S^2 + S \cdot \frac{g_{m1}}{C_1} \cdot \frac{1}{\beta} + \frac{g_{m1} \cdot g_{m2}}{C_1 \cdot C_2} \cdot \frac{1}{\beta}} \quad (8)$$

Furthermore, in view of the equation 8, a resonance frequency $\omega_0$ and a quality factor Q are represented by the following equations 9 and 10, respectively:

$$\omega_0 = \sqrt{\frac{g_{m1} \cdot g_{m2}}{C_1 \cdot C_2} \cdot \frac{1}{\beta}} \quad (9)$$

$$Q = \sqrt{\frac{g_{m2} \cdot C_1}{g_{m1} \cdot C_2} \cdot \beta} \quad (10)$$

By arranging the transistor $T_1$ in a succeeding stage of the differential amplifier 14a, as seen from the equation 9, it is possible to decrease the resonance frequency $\omega_0$ by $1/\sqrt{\beta}$ times a resonance frequency at a time that no transistor $T_1$ is provided. Furthermore, as seen from the equation 10, the quality factor Q can be increased by $\sqrt{\beta}$ times. Furthermore, if the capacitor of the capacitor $C_2$ is decreased by $1/\sqrt{\beta}$ times such that the resonance frequency $\omega_0$ is made as the same as the resonance frequency at the time that no transistor is provided, it is possible to reduce the capacity, and increase the quality factor Q by $\beta$ times.

In reference to FIG. 5, a filter circuit 10 of another embodiment according to the present invention includes structure approximately similar to that of the filter circuit 10 shown by FIG. 3 and FIG. 4 except that a transistor $T_7$ having an attenuation rate of $1/\beta$ is arranged in a stage succeeding to the differential amplifier 14b, and therefore, in the following, only a different point will be described, and a description of a similar point will be omitted.

Figure 5:
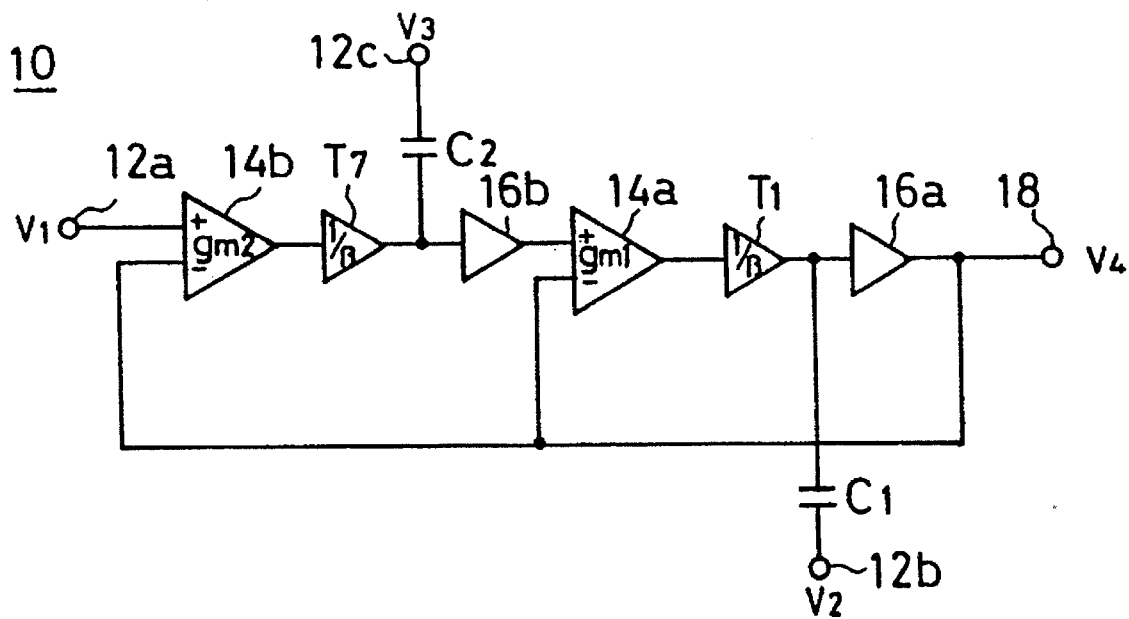
FIG. 5 is a block diagram showing another embodiment according to the present invention.

An equivalent circuit diagram of the filter circuit 10 shown in FIG. 5 is shown in FIG. 6. The output current from the differential amplifier 14b is passed through a collector and an emitter of the transistor $T_7$, whereby a current of $1/\beta$ times the output current from the differential amplifier 14b is outputted from a base of the transistor $T_7$. The base current and the input from the input terminal 12c are inputted to the buffer 16b, and the output from the buffer 16b is applied to the transistor $T_2$ included in the differential amplifier 14a.

A transfer function of the filter circuit 10 shown in FIG. 5 is represented by the following equation 11.

$$V_4 = \frac{S^2 V_2 + S \cdot \frac{g_{m1}}{C_1} \cdot \frac{1}{\beta} \cdot V_3 + \frac{g_{m1} \cdot g_{m2}}{C_1 \cdot C_2} \cdot \frac{1}{\beta^2} \cdot V_1}{S^2 + S \cdot \frac{g_{m1}}{C_1} \cdot \frac{1}{\beta} + \frac{g_{m1} \cdot g_{m2}}{C_1 \cdot C_2} \cdot \frac{1}{\beta^2}} \quad (11)$$

Furthermore, a resonance frequency $\omega_0$ and a quality factor Q can be represented by the following equations 12 and 13, respectively:

$$\omega_0 = \sqrt{\frac{g_{m1} \cdot g_{m2}}{C_1 \cdot C_2} \cdot \frac{1}{\beta^2}} \quad (12)$$

$$Q = \sqrt{\frac{g_{m2} \cdot C_1}{g_{m1} \cdot C_2}} \quad (13)$$

By providing the transistors $T_1$ and $T_7$, it is impossible to make the quality factor Q large as seen from the equation 13; however, it is possible to decrease the resonance frequency $\omega_0$ by $1/\beta$ times as seen from the equation 12. In addition, if the capacity of the capacitor $C_2$ is decreased by $1/\beta$ times so as to make the resonance frequency $\omega_0$ the same as the resonance frequency at a time that no transistors $T_1$ and $T_7$ are provided, not only the capacity can be made small but also the quality factor Q can be increased by $\sqrt{\beta}$ times.

In reference to FIG. 7, a filter circuit 10 of another embodiment according to the present invention includes structure as the same as structure of the filter circuit 10 shown in FIG. 7 except that a capacitor $C_3$ is inserted between one end of the capacitor $C_2$ and the output terminal of the buffer 16a, and therefore, in the following, only a different point will be described, and a description of a similar point will be omitted.

Figure 8:
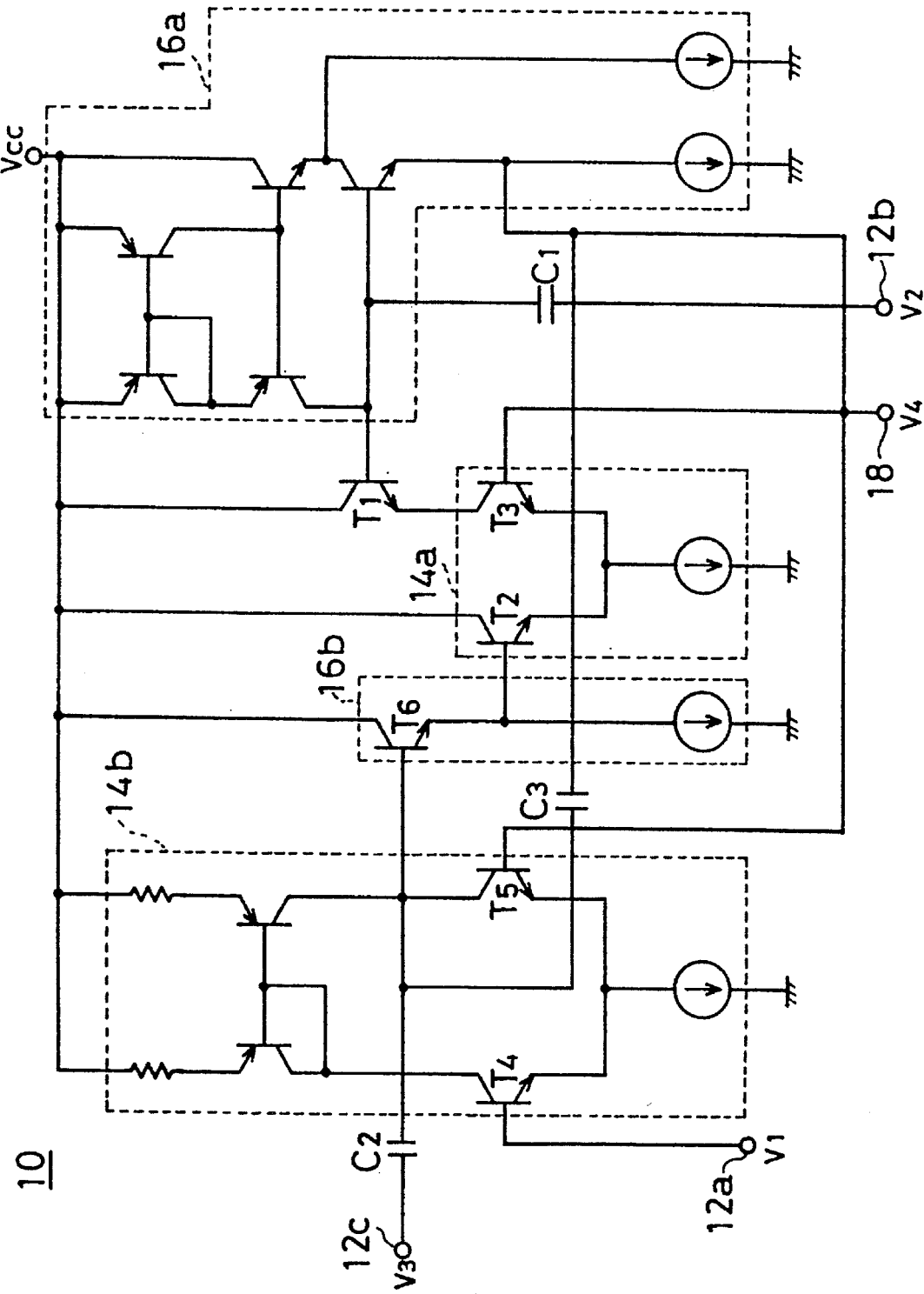
FIG. 8 is a circuit diagram showing FIG. 7 embodiment.

As seen from an equivalent circuit diagram shown in FIG. 8, the capacitor $C_3$ is inserted between the output of the differential amplifier 14b and the output of the buffer 16a.

Figure 7:
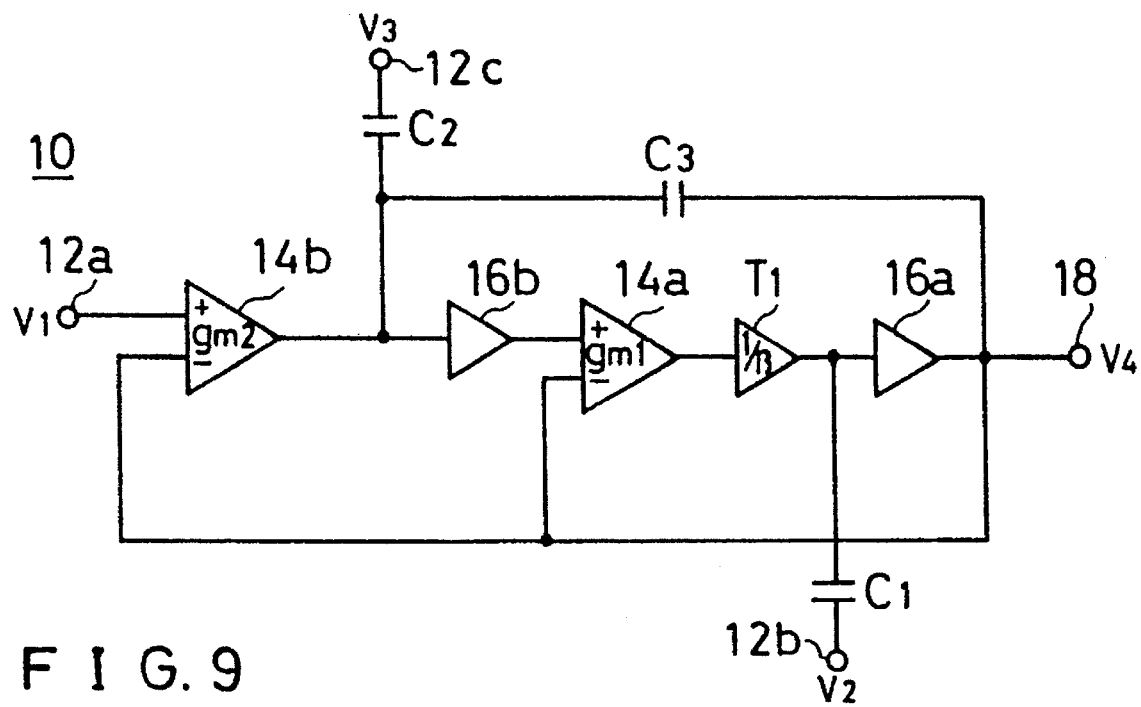
FIG. 7 is a block diagram showing another embodiment according to the present invention.

By adding the capacitor $C_3$, a transfer function of the filter circuit shown in FIG. 7 can be represented by the following equation 14:

$$V_4 = \quad (14)$$

$$\frac{S^2 V_2 + S \cdot \frac{C_2 \cdot g_{m1}}{C_1(C_2 + C_3)} \cdot \frac{1}{\beta} \cdot V_3 + \frac{g_{m1} \cdot g_{m2}}{C_1(C_2 + C_3)} \cdot \frac{1}{\beta} \cdot V_1}{S^2 + S \cdot \frac{C_2 \cdot g_{m1}}{C_1(C_2 + C_3)} \cdot \frac{1}{\beta} + \frac{g_{m1} \cdot g_{m2}}{C_1(C_2 + C_3)} \cdot \frac{1}{\beta}}$$

A resonance frequency $\omega_0$ and a quality factor Q can be represented by the following equations 15 and 16, respectively:

$$\omega_0 = \sqrt{\frac{g_{m1} \cdot g_{m2}}{C_1(C_2 + C_3)} \cdot \frac{1}{\beta}} \quad (15)$$

$$Q = \sqrt{\frac{g_{m2} \cdot C_1(C_2 + C_3)\beta}{g_{m1} \cdot C_2^2}} \quad (16)$$

As seen from the equation 15, it is possible to decrease the resonance frequency $\omega_0$ by $1/\sqrt{\beta}$ times a resonance frequency at a time that no transistor $T_1$ is provided. Furthermore, as seen from the equation 16, it is possible to increase the quality factor Q by $\sqrt{\beta}$ times a quality factor at the time no transistor $T_1$ is provided. Furthermore, if the capacities of the capacitors $C_2$ and $C_3$ are decreased by $1/\sqrt{\beta}$ times so as to make the resonance frequency $\omega_0$ the same as the resonance frequency at the time that no transistor $T_1$ is provided, not only can the capacities be made small but also the quality factor Q can further be increased.

In reference to FIG. 9, a filter circuit 10 of another embodiment according to the present invention includes structure approximately similar to the structure of the filter circuit 10 shown in FIG. 7, and therefore, in the following, only a different point will be described, and a description of a similar point will be omitted. The different point is a point that a transistor $T_7$ having an attenuation rate of $1/\beta$ is arranged at a stage succeeding to the differential amplifier 14b, and as seen from an equivalent circuit diagram of the filter circuit 10 shown in FIG. 10, the transistor $T_7$ is connected to the collector of the transistor $T_5$ included in the differential amplifier 14b.

Figure 9:
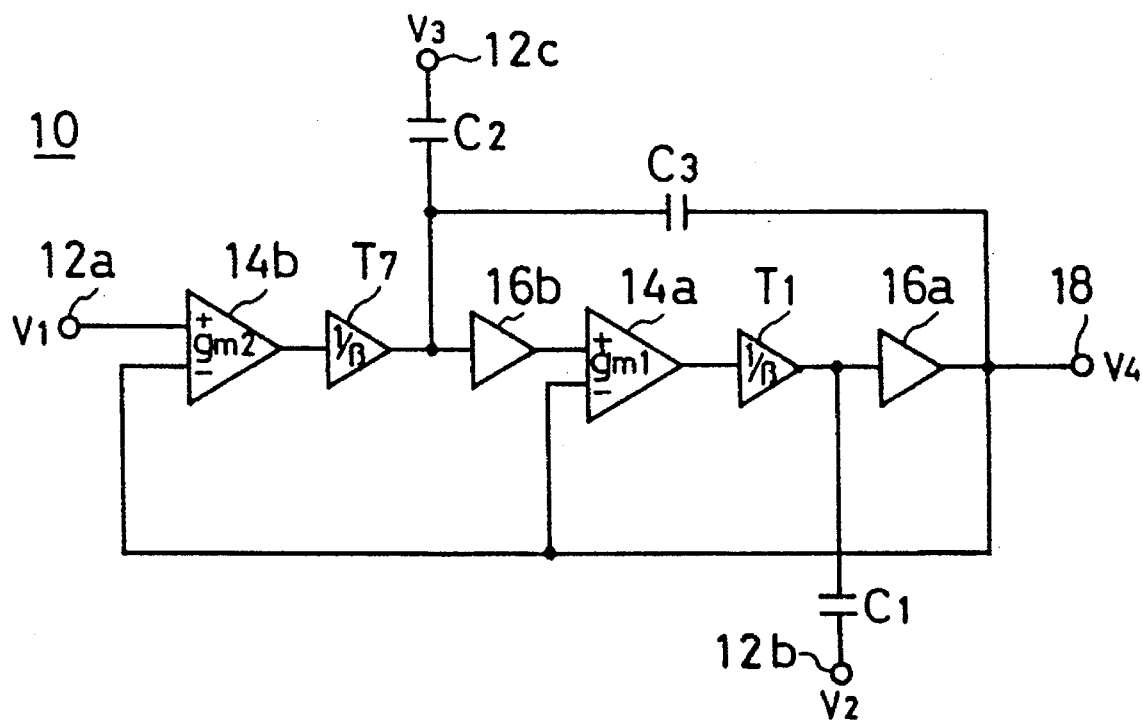
FIG. 9 is a block diagram showing another embodiment according to the present invention.
Figure 10:
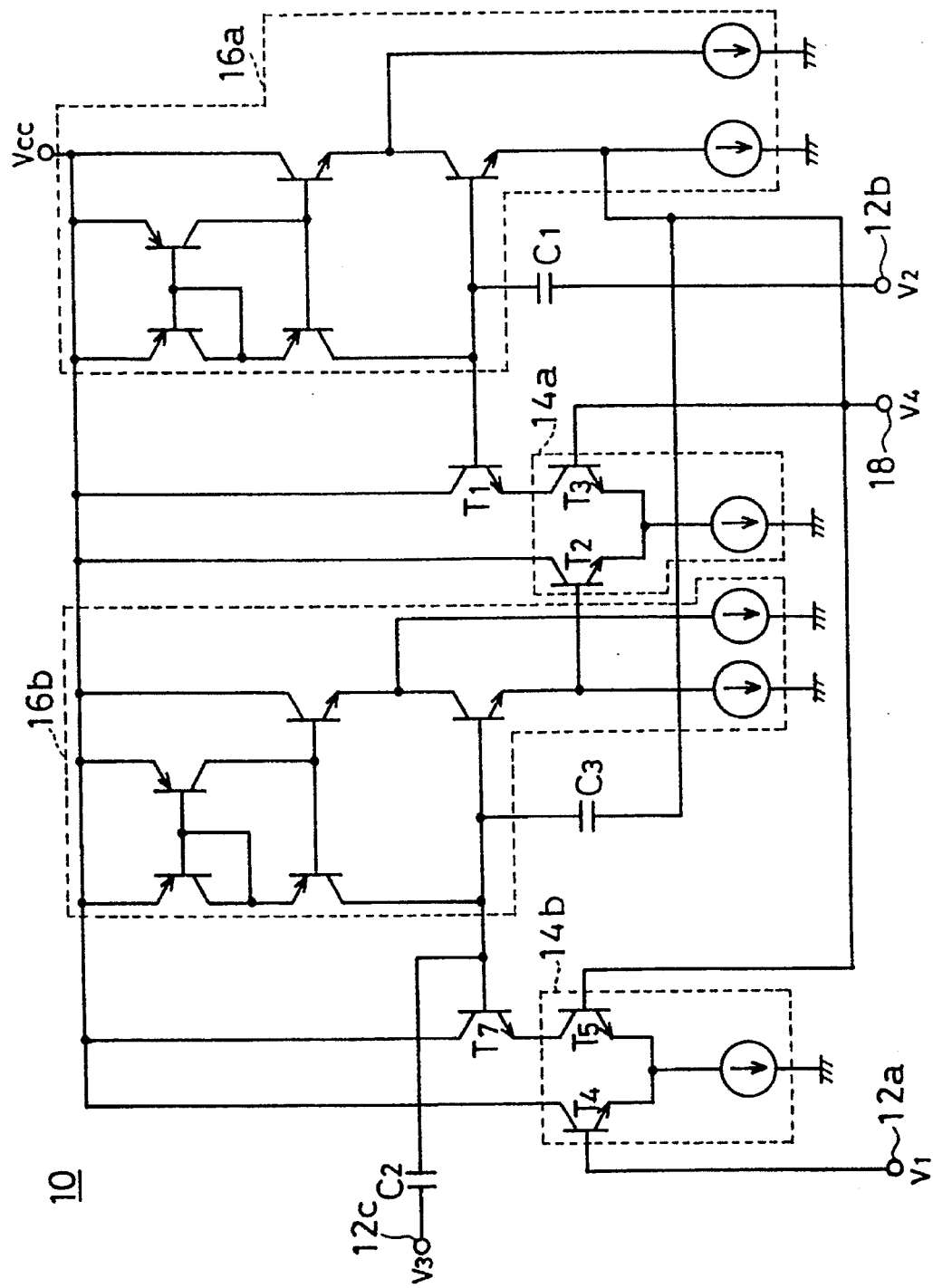
FIG. 10 is a circuit diagram showing FIG. 9 embodiment.

By adding such transistor $T_7$, a transfer function of the filter circuit 10 shown in FIG. 9 can be represented by the following equation 17:

$$V_4 = \quad (17)$$

$$\frac{S^2 V_2 + S \cdot \frac{C_2 \cdot g_{m1}}{C_1(C_2 + C_3)} \cdot \frac{1}{\beta} \cdot V_3 + \frac{g_{m1} \cdot g_{m2}}{C_1(C_2 + C_3)} \cdot \frac{1}{\beta^2} \cdot V_1}{S^2 + S \cdot \frac{C_2 \cdot g_{m1}}{C_1(C_2 + C_3)} \cdot \frac{1}{\beta} + \frac{g_{m1} \cdot g_{m2}}{C_1(C_2 + C_3)} \cdot \frac{1}{\beta^2}}$$

A resonance frequency $\omega_0$ and a quality factor Q can be represented by the following equations 18 and 19, respectively:

$$\omega_0 = \sqrt{\frac{g_{m1} \cdot g_{m2}}{C_1(C_2 + C_3)} \cdot \frac{1}{\beta^2}} \quad (18)$$

$$Q = \sqrt{\frac{g_{m2} \cdot C_1(C_2 + C_3)}{g_{m1} \cdot C_2^2}} \quad (19)$$

As seen from the equation 19, the quality factor Q becomes the same as a quality factor at a time that no transistors $T_1$ and $T_7$ are provided. However, the resonance frequency $\omega_0$ becomes, as seen from the equation 18, $1/\beta$ of a quality factor at the time that no transistors $T_1$ and $T_7$ are provided. In addition, if the capacities of the capacitors $C_2$ and $C_3$ are made be $1/\beta$ so as to make the resonance frequency $\omega_0$ the same as the resonance frequency at the time no transistors $T_1$ and $T_7$ are provided, it is possible to make the capacities small, and the quality factor Q large.

Figure 11:
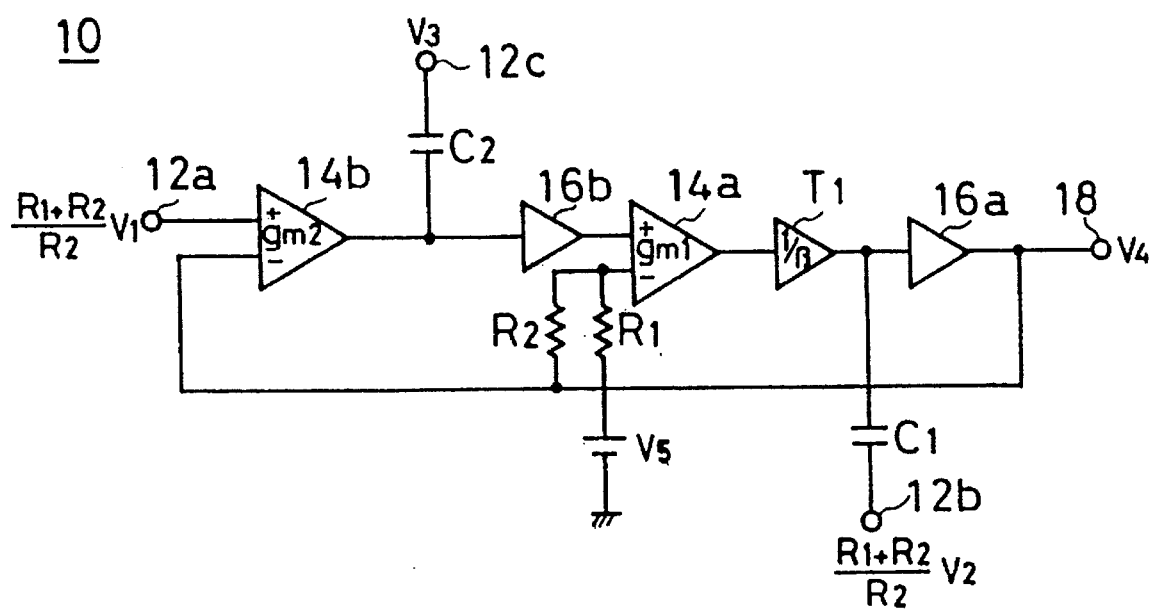
FIG. 11 is a block diagram showing another embodiment according to the present invention.

In reference to FIG. 11, a filter circuit 10 of another embodiment according to the present invention includes input terminals 12a, 12b and 12c, and the input terminal 12a is connected to a non-inverted input terminal of a differential amplifier 14b having a mutual conductance of $g_{m2}$. Furthermore, an output terminal of the differential amplifier 14b is connected to a non-inverted input terminal of a differential amplifier 14a having a mutual conductance of $g_{m1}$ via a buffer 16b, and an output terminal of the differential amplifier 14a is connected to an output terminal 18 via a transistor $T_1$ having an attenuation rate of $1/\beta$ and a buffer 16a. Furthermore, an output terminal of the buffer 16a is directly connected to an inverted input terminal of the differential amplifier 14b, and connected to the non-inverted input terminal of the differential amplifier 14a via a resistor $R_2$. A direct current voltage source $V_5$ is also connected to the inverted input terminal of the differential amplifier 14a via a resistor $R_1$. Furthermore, the input terminal 12c is connected to an output terminal of the differential amplifier 14b via a capacitor $C_2$, and the input terminal 12b is connected to an output terminal of the transistor $T_1$ via a capacitor $C_1$. Then, a signal is inputted from any one of the input terminals 12a, 12b and 12c, and a signal subjected to a filtering process is outputted from the output terminal 18.

Figure 12:
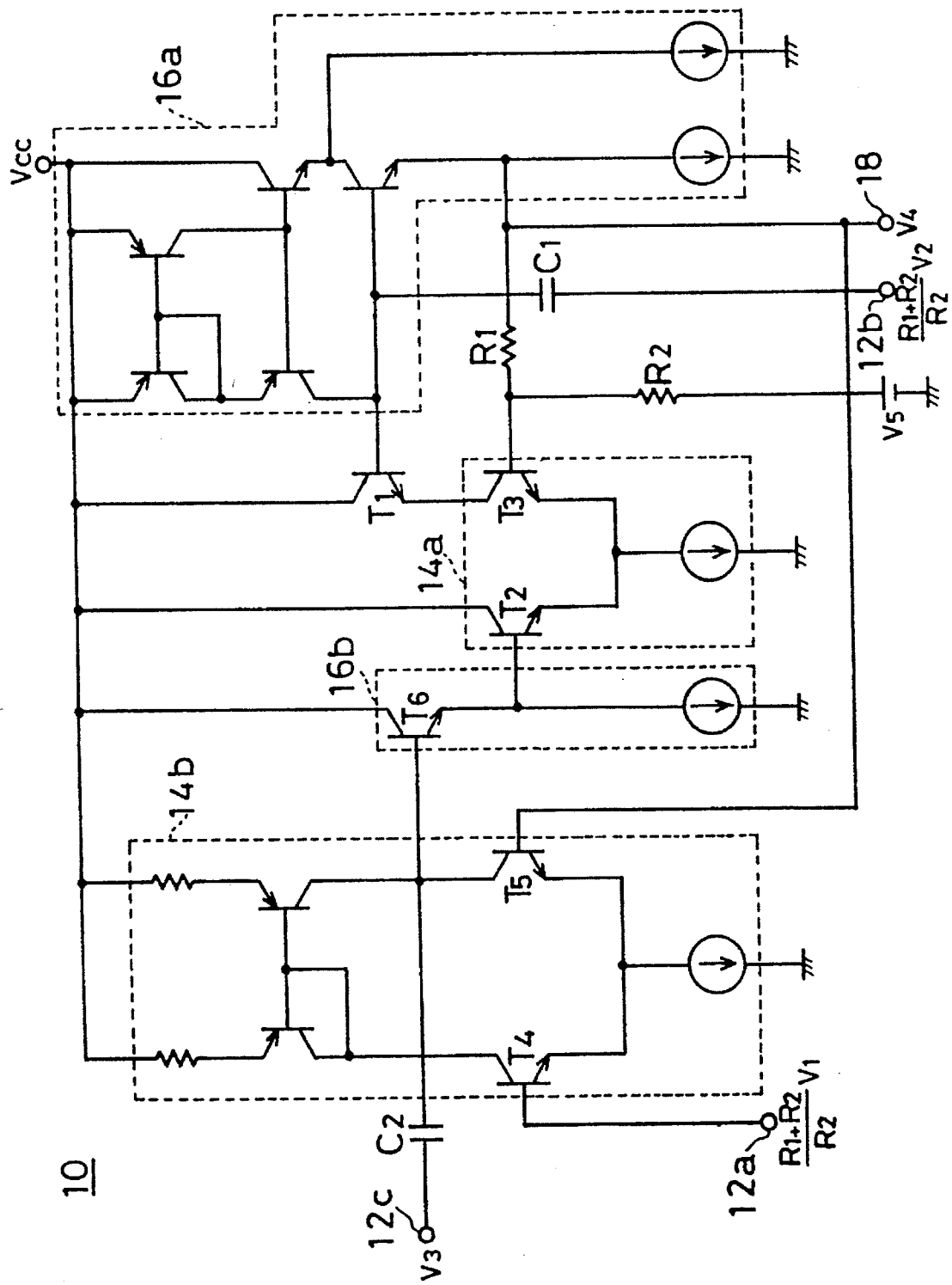
FIG. 12 is a circuit diagram showing FIG. 11 embodiment.

An equivalent circuit diagram of the filter circuit 10 is shown in FIG. 12. An input from the input terminal 12a is applied to a transistor $T_4$ included in the differential amplifier 14b, and a feeding-back output from the buffer 16a is inputted to a transistor $T_5$ included in the differential amplifier 14b. Therefore, an output in proportion to a difference between the two inputs is inputted to a transistor $T_6$ included in the buffer 16b. To the transistor $T_6$, an input signal from the input terminal 12c is also applied through the capacitor $C_2$. The output from the buffer 16b according to these inputs is inputted to the transistor $T_2$ included in the differential amplifier 14a. The feeding-back output from the buffer 16a and an output from the direct current voltage source $V_5$ are inputted to the transistor $T_3$ included in the differential amplifier 14a through the resistors $R_1$ and $R_2$, respectively, and an output in proportion to a difference between these inputs is inputted to the transistor $T_1$. That is, an output current of the differential amplifier 14a flows between a collector and an emitter of the transistor $T_1$, whereby a current of $1/\beta$ times the output current from the differential amplifier 14a is outputted from a base of the transistor $T_1$, and the same is inputted to the buffer 16a. An input from the input terminal 12b is also applied to the buffer 16a through the capacitor $C_1$. Then, the output from the buffer 16a is outputted from the output terminal 18, and fed-back to the differential amplifiers 14a and 14b.

On the assumption that the inputs from the input terminals 12a, 12b and 12c are $(R_1+R_2)V_1/R_2$, $(R_1+R_2)V_2/R_2$ and $V_3$, respectively, and the output from the output terminal 18 is $V_4$, a transfer function of the filter circuit 10 of this embodiment shown can be represented by the following equation 20:

$$V_4 = \frac{R_1 + R_2}{R_2} \cdot \quad (20)$$

-continued
$$\frac{S^2 V_2 + S \cdot \frac{R_2}{R_1 + R_2} \cdot \frac{g_{m1}}{C_1} \cdot \frac{1}{\beta} \cdot V_3 + \frac{g_{m1} + g_{m2}}{C_1 \cdot C_2} \cdot \frac{1}{\beta} \cdot V_1}{S^2 + S \cdot \frac{R_2}{R_1 + R_2} \cdot \frac{g_{m1}}{C_1} \cdot \frac{1}{\beta} + \frac{g_{m1} \cdot g_{m2}}{C_1 \cdot C_2} \cdot \frac{1}{\beta}}$$

Furthermore, a resonance frequency $\omega_0$ and a quality factor Q can be also represented by the following equations 20 and 21, respectively:

$$\omega_0 = \sqrt{\frac{g_{m1} \cdot g_{m2}}{C_1 \cdot C_2} \cdot \frac{1}{\beta}} \quad (21)$$

$$Q = \frac{R_1 + R_2}{R_2} \cdot \sqrt{\frac{g_{m2} \cdot C_1}{g_{m1} \cdot C_2} \cdot \beta} \quad (22)$$

As seen from the equation 21, by adding the transistor $T_1$, it is possible to decrease the resonance frequency $\omega_0$ by $1/\sqrt{\beta}$ times a resonance frequency at a time that no transistor $T_1$ is provided. Furthermore, as seen from the equation 22, the quality factor Q can be increased by $\sqrt{\beta}$ times a quality factor at the time that no transistor $T_1$ is provided. Furthermore, if the capacity of the capacitor $C_2$ is decreased by $1/\sqrt{\beta}$ times so as to make the resonance frequency $\omega_0$ as the same as a resonance frequency at a time that no transistor $T_1$ is added, it is possible to increase the quality factor Q by $\beta$ times.

In reference to FIG. 13, a filter circuit 10 of another embodiment according to the present invention is approximately similar to the filter circuit 10 shown in FIG. 11, and therefore, only a different point will be described, and a description of a similar point will be omitted here. A transistor $T_7$ having an attenuation rate of $1/\beta$ is arranged at a stage succeeding to the differential amplifier 14b, and as seen from an equivalent circuit diagram of the filter circuit 10 shown in FIG. 14, the transistor is arranged at a collector of the transistor $T_5$ included in the differential amplifier 14b. Therefore, the output current of the differential amplifier 14b is made be $1/\beta$ by transistor $T_7$, and an output current from the transistor $T_7$ is inputted to the buffer 16b.

Therefore, a transfer function of the filter circuit 10 of this embodiment shown can be represented by the following equation 23:

$$V_4 = \frac{R_1 + R_2}{R_2} \cdot \quad (23)$$

$$\frac{S^2 V_2 + S \cdot \frac{R_2}{R_1 + R_2} \cdot \frac{g_{m1}}{C_1} \cdot \frac{1}{\beta} \cdot V_3 + \frac{g_{m1} + g_{m2}}{C_1 \cdot C_2} \cdot \frac{1}{\beta^2} \cdot V_1}{S^2 + S \cdot \frac{R_2}{R_1 + R_2} \cdot \frac{g_{m1}}{C_1} \cdot \frac{1}{\beta} + \frac{g_{m1} \cdot g_{m2}}{C_1 \cdot C_2} \cdot \frac{1}{\beta^2}}$$

Then, in view of the equation 23, a resonance frequency $\omega_0$ and a quality factor Q are represented by the equations 24 and 25, respectively:

$$\omega_0 = \sqrt{\frac{g_{m1} \cdot g_{m2}}{C_1 \cdot C_2} \cdot \frac{1}{\beta^2}} \quad (24)$$

$$Q = \frac{R_1 + R_2}{R_2} \cdot \sqrt{\frac{g_{m2} \cdot C_1}{g_{m1} \cdot C_2}} \quad (25)$$

As seen from the equations 24 and 25, by adding the transistors $T_1$ and $T_7$, the quality factor Q becomes not to be changed in comparison with a case where the transistors $T_1$ and $T_7$ are not added; however, it is possible to decrease the resonance frequency $\omega_0$ by $1/\beta$ times the resonance frequency of the case where no transistor $T_1$ and the transistor $T_7$ are added. However, if the capacity of the capacitor $C_2$ is decreased by $1/\beta$ times such that the resonance frequency $\omega_0$ is made be the same as the resonance frequency at a time that no transistors $T_1$ and $T_7$ are added, it is possible to increase the quality factor Q by $\beta$ times.

Figure 13:
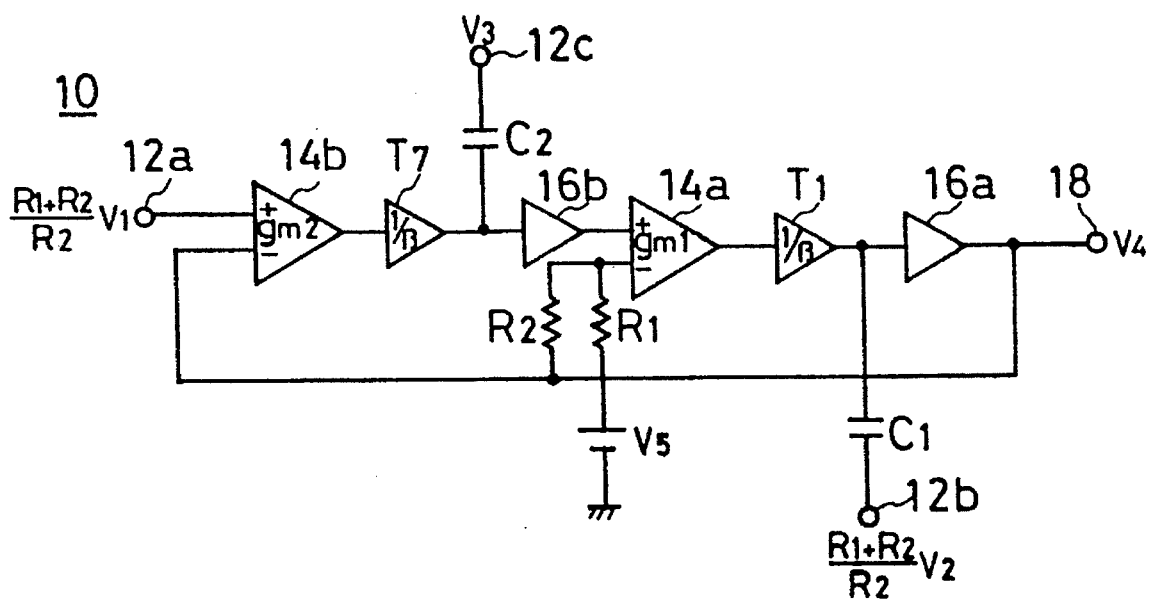
FIG. 13 is a block diagram showing a further embodiment according to the present invention.
Figure 15:
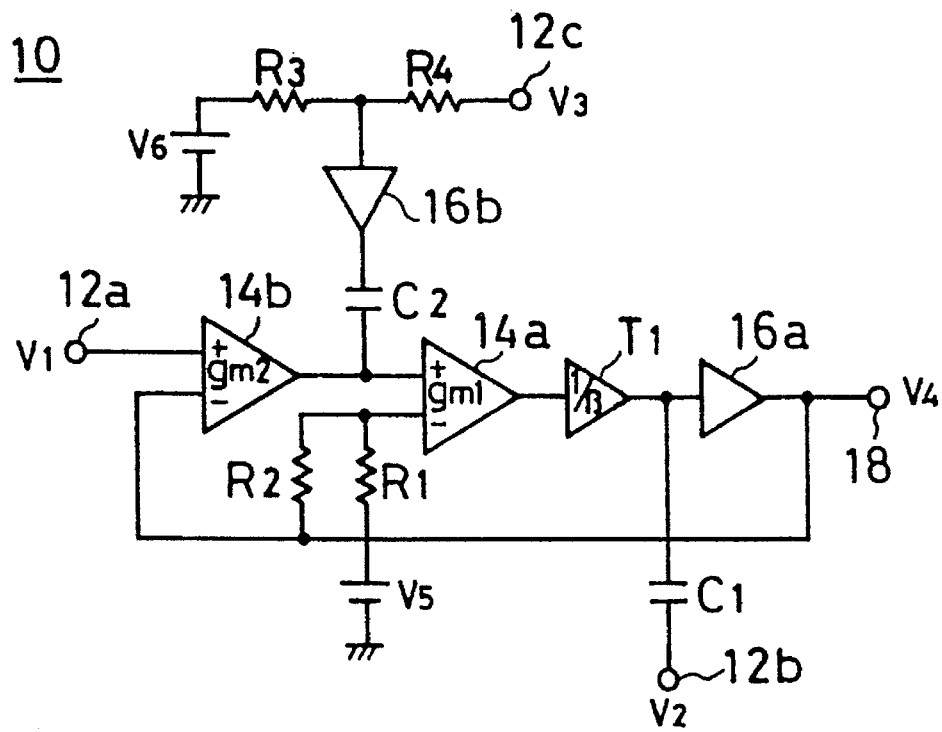
FIG. 15 is a block diagram showing another embodiment according to the present invention.
Figure 16:
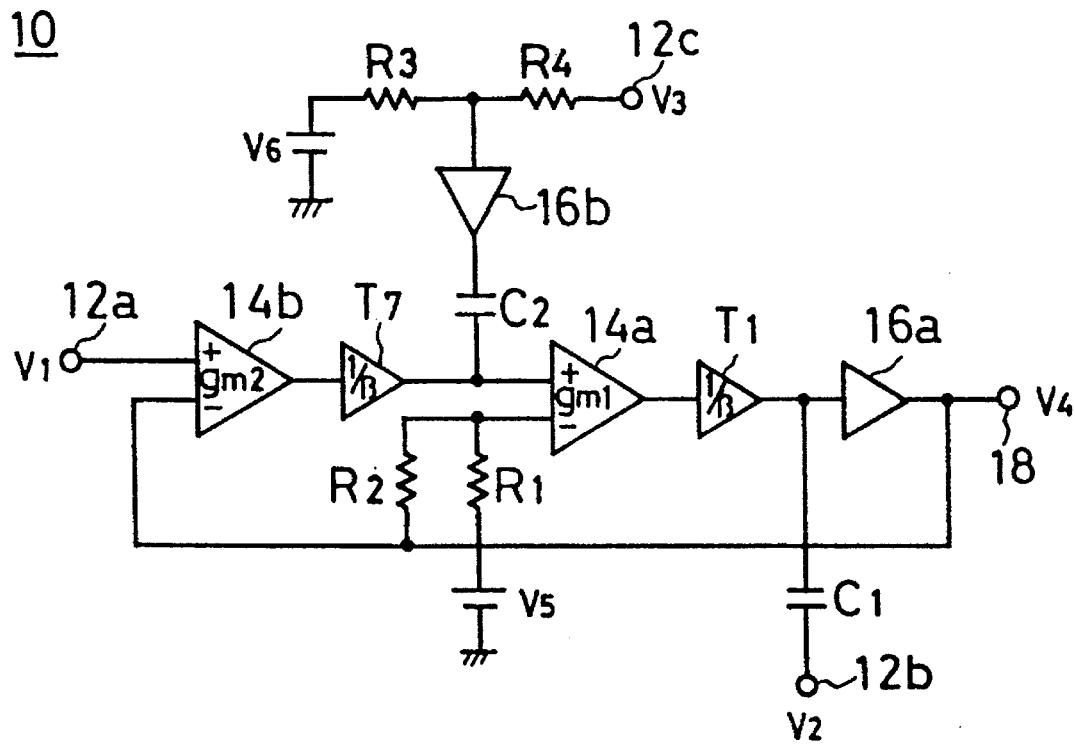
FIG. 16 is a block diagram showing other embodiment according to the present invention.
Figure 18:
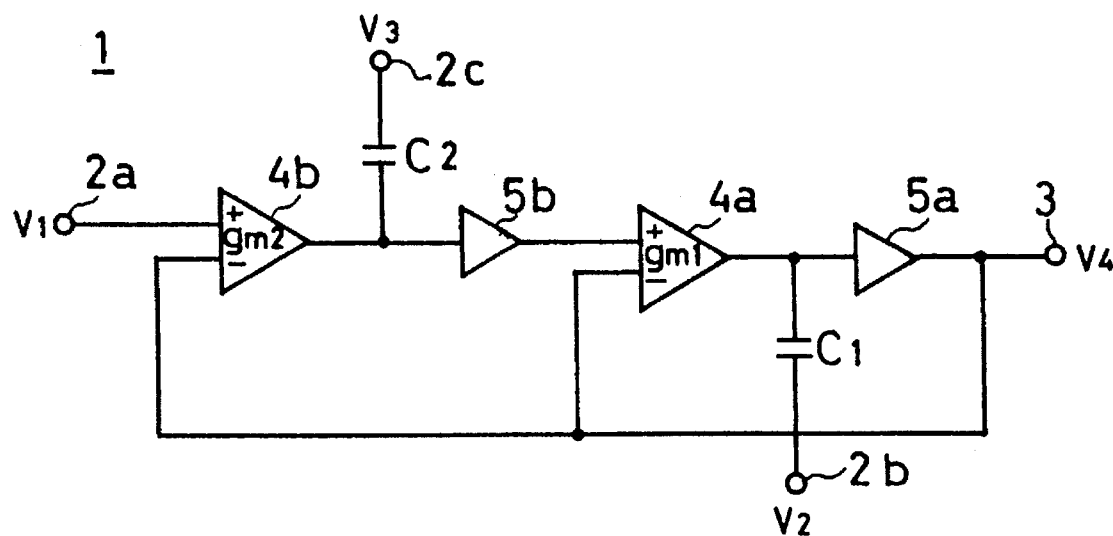
FIG. 18 is a block diagram showing another prior art.
Figure 17:
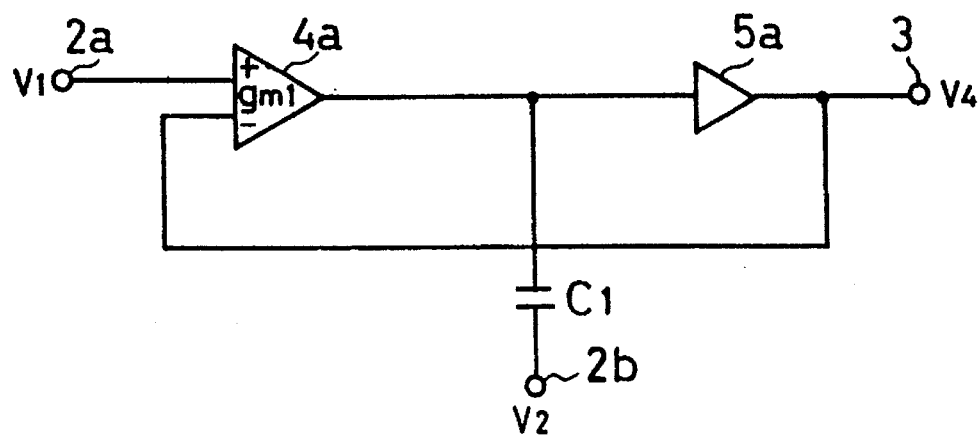
FIG. 17 is a block diagram showing a prior art.

In addition, in the filter circuits 10 shown in FIG. 11 and FIG. 13, the inputs from the input terminals 12a and 12b are made be $(R_1+R_2)/R_2 \cdot V_1$ and $((R_1+R_2)/R_2 \cdot V_2$, and therefore, an amplifier (not shown) is required to be provided in a stage preceding to the input terminals 12a and 12b. In order to solve such a problem, the filter circuit may be constructed as shown in FIG. 15 and FIG. 16. That is, resisters $R_3$ and $R_4$ are connected in parallel to one end of the capacitor $C_2$ via the buffer 16b, and the resistor $R_3$ and the resistor $R_4$ may be connected to a direct current voltage source $V_6$ and the input terminal 12c, respectively.

In the filter circuit 10 thus constructed, if the inputs from the input terminals 12a, 12b and 12c are $V_1$, $V_2$ and $V_3$, respectively. A transfer function of the filter circuit 10 shown in FIG. 13 becomes to be represented by the following equation 26:

$$V_4 = \frac{S^2 V_2 + S \cdot \frac{R_3}{R_3+R_4} \cdot \frac{g_{m1}}{C_1} \cdot \frac{1}{\beta} \cdot V_3 + \frac{g_{m1} \cdot g_{m2}}{C_1 \cdot C_2} \cdot \frac{1}{\beta} \cdot V_1}{S^2 + S \cdot \frac{R_2}{R_1+R_2} \cdot \frac{g_{m1}}{C_1} \cdot \frac{1}{\beta} + \frac{g_{m1} \cdot g_{m2}}{C_1 \cdot C_2} \cdot \frac{1}{\beta}} \quad (26)$$

Now, if $R_2/(R_1+R_2)=R_3/(R_3+R_4)$, the equation 26 can be represented by the following equation 27, and in view of the equation 27, the resonance frequency $\omega_0$ and the quality factor Q are represented by the following equations 28 and 29, respectively:

$$V_4 = \frac{S^2 V_2 + S \cdot \frac{R_3}{R_1+R_2} \cdot \frac{g_{m1}}{C_1} \cdot \frac{1}{\beta} \cdot V_3 + \frac{g_{m1} \cdot g_{m2}}{C_1 \cdot C_2} \cdot \frac{1}{\beta} \cdot V_1}{S^2 + S \cdot \frac{R_2}{R_1+R_2} \cdot \frac{g_{m1}}{C_1} \cdot \frac{1}{\beta} + \frac{g_{m1} \cdot g_{m2}}{C_1 \cdot C_2} \cdot \frac{1}{\beta}} \quad (27)$$

$$\omega_0 = \sqrt{\frac{g_{m1} \cdot g_{m2}}{C_1 \cdot C_2} \cdot \frac{1}{\beta}} \quad (28)$$

$$Q = \frac{R_1+R_2}{R_2} \cdot \sqrt{\frac{g_{m2} \cdot C_1}{g_{m1} \cdot C_2} \cdot \beta} \quad (29)$$

Accordingly, it will be understood that the equations 28 and 29 are the same as the equations 21 and 22.

Figure 14:
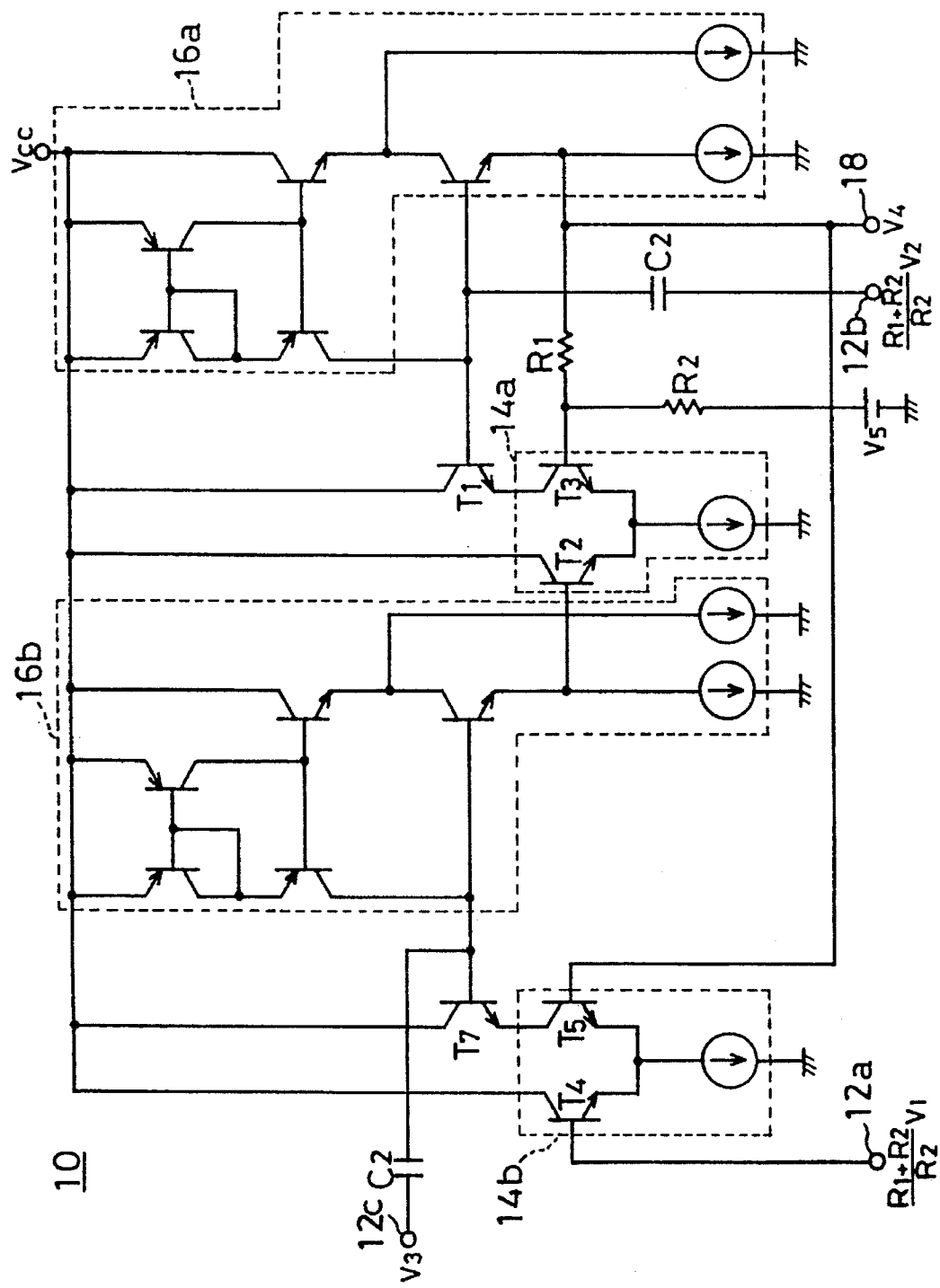
FIG. 14 is a block diagram showing another embodiment according to the present invention.

Furthermore, as to the filter circuit 10 shown in FIG. 14, if $R_2/(R_1+R_2)=R_3/(R_3+R_4)$, the transfer function can be represented by the following equation 30, and the resonance frequency $\omega_0$ and the quality factor Q can be represented by the following equations 31 and 32:

$$V_4 = \quad (30)$$

$$\frac{S^2 V_2 + S \cdot \frac{R_3}{R_1+R_2} \cdot \frac{g_{m1}}{C_1} \cdot \frac{1}{\beta} \cdot V_3 + \frac{g_{m1} \cdot g_{m2}}{C_1 \cdot C_2} \cdot \frac{1}{\beta^2} \cdot V_1}{S^2 + S \cdot \frac{R_2}{R_1+R_2} \cdot \frac{g_{m1}}{C_1} \cdot \frac{1}{\beta} + \frac{g_{m1} \cdot g_{m2}}{C_1 \cdot C_2} \cdot \frac{1}{\beta^2}}$$

$$\omega_0 = \sqrt{\frac{g_{m1} \cdot g_{m2}}{C_1 \cdot C_2} \cdot \frac{1}{\beta^2}} \quad (31)$$

$$Q = \frac{R_1+R_2}{R_2} \cdot \sqrt{\frac{g_{m2} \cdot C_1}{g_{m1} \cdot C_2}} \quad (32)$$

Accordingly, it will be understood that the equations 31 and 32 are the same as the equations 24 and 25.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A filter circuit, comprising:

first, second and third terminals;

a first integrator having a first input and a second input, said first input and said second input of said first integrator being connected to the first terminal and the third terminal, respectively;

a first current attenuation means which is coupled between an output of the first integrator said third terminal, and attenuates an output current of the first integrator; and a first capacitor connected between an output of the first current attenuation means and the second terminal, wherein when input signals are applied from of the first terminal and the second terminal, an output signal is obtained from the third terminal, wherein said first current attenuation means is a transistor which attenuates the output current by $1/\beta$, whereby $\beta$ is a current amplification factor of said transistor.

2. A filter circuit according to claim 1, further comprising:

a second integrator having a first input and a second input respectively connected to the first terminal and the third terminal, and an output connected to the first input of the first integrator;

a fourth terminal; and a second capacitor connected between the first input of the first integrator and the fourth terminal, wherein when an input signal is applied from at least one of the first terminal, the second terminal and the fourth terminal, an output signal is obtained from the third terminal.

3. A filter circuit according to claim 2, further comprising a second current attenuation means which is connected between an output of the second integrator and a connection point of the fourth terminal and the first input of the first integrator, and attenuates an output current of the second integrator.

4. A filter circuit according to claim 2 or 3, further comprising a third capacitor connected between the third terminal and the output of the second integrator.

5. A filter circuit according to claim 2 or 3, further comprising:

a direct current voltage source;

a first resistor connected between the direct current voltage source and the second input of the first integrator; and a second resistor connected between the third terminal and the second input of the first integrator.

6. A filter circuit according to claim 2 or 3, further comprising:

first and second direct current voltage sources;

a first resistor connected between the first direct current voltage source and the second input of the first integrator;

a second resistor connected between the third terminal and the second input of the first integrator;

a third resistor connected between the second direct current voltage source and the second capacitor; and a fourth resistor connected between the fourth terminal and the second capacitor.

7. A filter circuit according to claim 5, wherein at least one of said first current attenuation means and said second current attenuation means is a transistor circuit which attenuates an input current by $1/\beta$ ($\beta$ is a current amplification factor).

8. A filter circuit according to claim 6, wherein at least one of said first current attenuation means and said second current attenuation means is a transistor circuit which attenuates an input current by $1/\beta$ ($\beta$ is a current amplification factor).

* * * * *